[11] 3,611,350

United States Patent

[72] Inventors Lawrence M. Leibowitz
Fairfax, Va.;
Richard K. Baldauf, Greenbelt, Md.
[21] Appl. No. 10,941
[22] Filed Feb. 12, 1970
[45] Patented Oct. 5, 1971
[73] Assignee The United States of America as represented by the Secretary of the Navy

[54] HIGH-SPEED PARALLEL ANALOG-TO-DIGITAL CONVERTER
7 Claims, 2 Drawing Figs.

[52] U.S. Cl. .......... 340/347 AD, 325/38 A
[51] Int. Cl. .......... H03k 13/02
[50] Field of Search .......... 340/347; 325/38 A

[56] References Cited
UNITED STATES PATENTS

| | | | |
|---|---|---|---|
| 3,267,459 | 8/1966 | Chomicki | 325/38 A |
| 3,016,528 | 1/1962 | Villars | 340/347 |
| 3,369,229 | 2/1968 | Dorros | 325/38 A |
| 3,302,193 | 1/1967 | Sipress | 325/38 A |
| 3,065,422 | 11/1962 | Villars | 340/347 |
| 3,015,815 | 1/1962 | Mann | 340/347 |
| 2,733,432 | 1/1956 | Breckman | 340/347 |

*Primary Examiner*—Maynard R. Wilbur
*Assistant Examiner*—Jeremiah Glassman
*Attorneys*—R. S. Sciascia, Arthur L. Branning and J. G. Murray

ABSTRACT: Analog-to-digital converter wherein a multilevel detector containing comparators and a resistor chain evaluates the analog voltage and produces signals which are coded into binary form by gating circuitry. Rapid conversion is obtained in a single clock pulse interval during which the clock pulse synchronizes all signals passing through a plurality of flip-flops. All signal paths have the same number of logic levels.

INVENTORS

LAWRENCE M. LEIBOWITZ
RICHARD K. BALDAUF

BY

James G. Murray ATTORNEY

INVENTORS

LAWRENCE M. LEIBOWITZ
RICHARD K. BALDAUF

BY

ATTORNEY

HIGH-SPEED PARALLEL ANALOG-TO-DIGITAL CONVERTER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Because of the obvious need, the technology of analog-to-digital (A/D) signal conversion has become highly developed. The majority of prior known (A/D) signal converters have used, with some variations, one or the other of two general methods which are often called the Ramp Conversion Method and the Successive Approximations, or Feedback Conversion, Method.

In the Ramp Conversion Method clock pulses are counted as they are converted in a ramp device, such as a storage capacitor, into a voltage which is proportional to the pulse count. When this voltage equals the unknown analog input voltage the counter is inhibited and presents a digital display or signal of the unknown voltage.

In the Feedback Conversion or Successive Approximations Method, the apparatus used generates from the first clock pulse a digital word with the highest order bit in its logical "1" state and lower order bits in their logical "0" state. A digital-to-analog (D/A) conversion is performed on this word and the generated voltage is then compared to the unknown analog input voltage. If the input voltage is less than the generated voltage, the highest order bit is complemented, i.e. changed to the "0" state. If the input voltage exceeds the generated voltage, the highest order bit remains in its logical "1" state. At the next clock pulse, a digital word is generated with the highest order bit as previously determined and the second highest order bit in its logical "1" state with all lower order bits in their logical "0" state. The comparison procedure just described is again followed. In obvious manner after $n$ clock pulses an $n$-bit digital representation of the input analog voltage is generated.

The primary disadvantage of both of the described methods is the inherent slow speed of operation. The Ramp Conversion Method requires up to $2^n$ clock pulse intervals to perform a conversion while the Feedback Conversion Method requires $n$ clock pulse intervals. At normal speeds of operation, both methods generally require that the input analog voltage be maintained by sample and hold circuitry at the initial input level during the conversion process. The use of such circuitry to some degree, decreases the accuracy of the signal conversion.

SUMMARY OF THE INVENTION

The invention described herein embraces the advantages of prior known A/D converters and advantageously requires only a single clock pulse interval to perform an A/D conversion. To attain this rapid conversion, the invention described herein uses a multilevel detector which contains a plurality of comparators and a resistor chain that provides a plurality of reference voltage levels. The multilevel detector compares the reference voltage levels with the unknown analog input signal and produces signals that are synchronized in flip-flops by a clock pulse and which are converted by gating circuitry into a parallel binary word which includes a polarity bit and which is representative of the analog input signal. The synchronism established by the clock controlled flip-flops is maintained by having all signal paths include the same number of logic levels.

OBJECTS

It is therefore an object of this invention to provide an improved and more rapid analog-to-digital signal converter which is also highly accurate.

Another object is the provision of a very rapid analog-to-digital signal converter that requires only a single pulse interval for operation.

Yet another object of the present invention is to provide a very rapid analog-to-digital signal converter that requires only a single pulse interval for operation and which includes a multilevel detector that compares the unknown analog input signal with a plurality of reference voltage levels and produces a group of signals that are converted by gating circuitry into a parallel binary word which includes a polarity bit and which is representative of the analog input signal.

A still further object is the provision of a very rapid analog-to-digital signal converter wherein all signal paths include the same number of logic levels to thereby maintain a signal synchronism that is established as the signals pass through a signal stage which includes a plurality of clock controlled flip-flops.

DESCRIPTION OF THE DRAWINGS

Other objects and features of the invention will become apparent to those skilled in the art as the disclosure is made in the following description of a preferred embodiment of the invention as illustrated in the accompanying drawings in which.

DESCRIPTION OF THE PREFERRED EMBODIMENT

Figure 1:
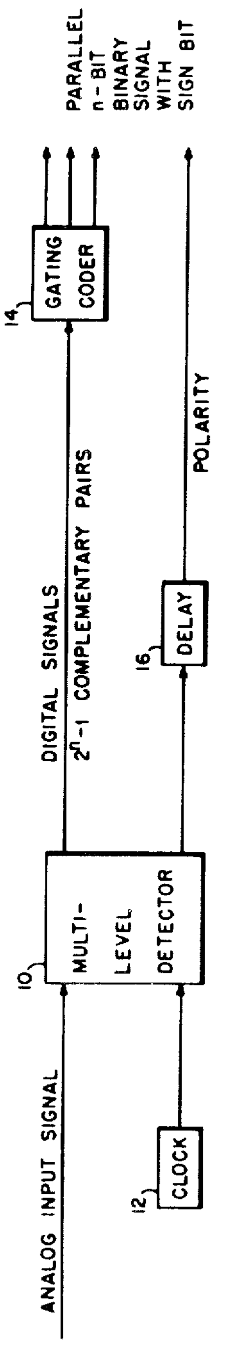
FIG. 1 is a block diagram of the invention.

Referring now to FIG. 1 which illustrates the invention in a broad manner, it will be seen that the multilevel detector 10 is connected to receive the analog input signal and to be controlled by the clock 12. Every pulse of clock 12, which can be quite high frequencies such as 10 MHz, causes the detector 10 to produce a digital representation of the analog input signal in the form of $2^n-1$ pairs of complementary signals and a polarity signal. Gating coder 14 receives the $2^n-1$ pairs of complementary signals and produces a parallel $n$-bit digital signal that is representative in binary code of the analog input signal. The parallel sign bit signal is maintained in proper time relationship with the other signals by an appropriated delay 16.

While the invention, for convenience of description, will subsequently be described primarily in terms of the gating coder 14 producing output signals representative of the analog input in the conventional binary code, it will be obvious to all persons skilled in the art of signal conversion, particularly as applied to the field of securely transmitting military information, that more sophisticated use can be made of the present invention. In this regard it need only be mentioned that the invention could be used as the basic part of a secure communications system by having the gating coder 14 constructed in a plurality of modular forms, each having a different coding arrangement, and inserting different components 14 at predetermined times and in predetermined coding sequences.

Figure 2:
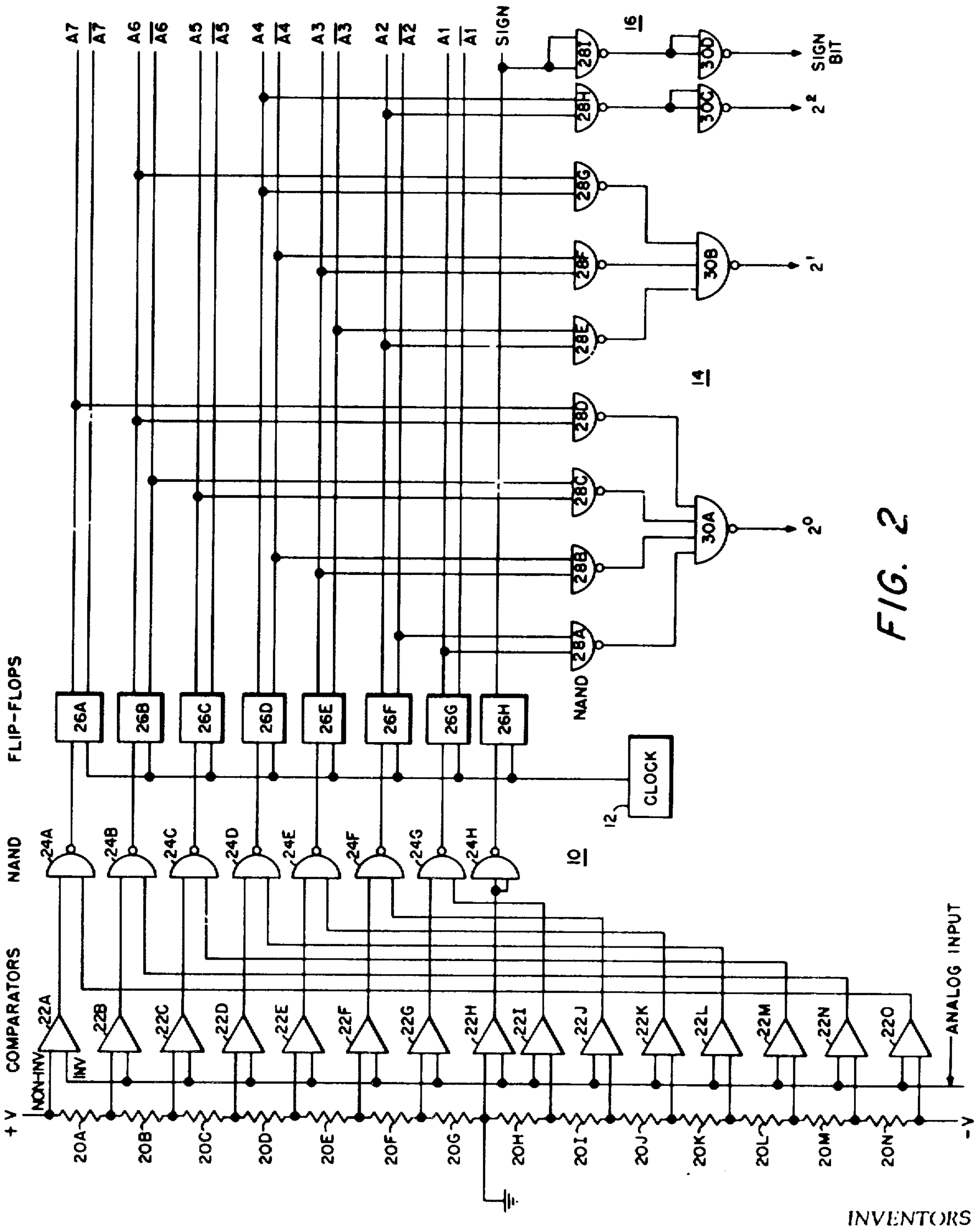
FIG. 2 illustrates the preferred embodiment in greater detail.

In FIG. 2 the invention is illustrated in more detail. For purposes of specificity, while maintaining the drawing in a simple form, FIG. 2 illustrates the invention for the extremely simple case where $n$, i.e. the number of digital bits in the output signal, is equal to three. It will, of course, be apparent to the reader that circuits for larger $n$ can be constructed by merely using a larger number of components in an obviously analogous manner.

As shown in FIG. 2, a chain of $2(2^n-1)$ serially connected identical resistors 20A...N are connected between two reference potential sources V and −V which are equal in absolute quantitative value but different in polarity. The midpoint of the resistor chain 20 is connected to ground. The described embodiment of the invention also includes a plurality of comparator circuits 22A...O, i.e. the number of comparator circuits 22 is $2(2^n-1)+1$ or one in excess of the number of resistors 20A...N. Each comparator circuit is characterized by having two input leads and functions to provide an output signal that is either logical "1" or logical "0" depending on whether the larger input signal is on the noninverting or on the inverting input lead, respectively. As illustrated, the noninverting input lead is the top lead for each comparator. High-speed circuits suitable for use as the comparators 22A...0 are well known in the electronic arts.

The ground connection and the ends of resistors 20A...G, i.e. the junctions at or above ground reference, are connected to the noninverting input leads of comparators 22A...H while the ends of the resistors 20H...N, i.e. The junctions in resistor chain 20 which are below ground reference, are connected to the inverting input leads of comparators 22I...0. The analog input signal is connected to the other input lead of each of the comparator circuits 22A...0.

Each of the results of the positive comparisons, by comparators 22A...G, are combined in NAND inverting gates 24A...G with the results of analogous negative comparisons by comparators 22O...I to produce an immediate indication, regardless of polarity, i.e. by absolute value, of whether a particular magnitude of voltage, as formed in the resistor chain 20A...N, is exceeded by the analog input voltage. The polarity determination by comparator 22H is connected to the inverting gate 24H. As the reader will observe, the number of gates 24A...H is equal to $2^n$.

CLock 12, together with the inverted outputs of NAND gates 24A...H, is connected to the flip-flops 26A...H which serve as a logic level store that synchronizes the subsequent coding operations. These coding operations are accomplished by the two logic levels of NAND inverting gates 28A...H and 30A...C which are connected, as shown, to convert the complementary outputs A1, $\overline{A1}$...A1, $\overline{A7}$ of flip-flops 26A...G into the binary outputs $2^0$, $2^1$ and $2^2$. To preserve the synchronism of the sign bit, flip-flop 26H is connected to two logic levels of inversions, i.e. the inverting gates 28I and 30D, which are analogous to delay 16 in FIG. 1. The reader has, no doubt, also found it evident that the components 20, 22, 24 and 26 function together as the multilevel detector 10 of FIG. 1 and that components 28 and 30 function as the gating coder 14.

Considering now, by way of further explanation, the situation when the reference voltages V and −V are respectively 7 and −7 volts and the analog input signal is instantaneously −6.1 volts. The outputs of comparators 22A and 22-0 will be logical "1" since the V and −V (7 volt) reference signals exceed the −6.1 volt analog input signal in absolute value and since the positive reference V is connected to the noninverting lead of comparator 22A and the negative reference voltage −V is connected to the inverting lead of comparator 22-0. These logical "1" signals produce a logical "0" output from NAND inverting gate 24A which in turn cause the $\overline{A7}$ output of flip-flop 26A to be a logical "1" and the A7 output to be a logical "0" when clocked. The outputs of comparators 22I...N are logical "0" since the predominant analog input signal is connected to the noninverting leads of these comparators. This causes the outputs of the NAND inverting gates 24B...G to be logical "1" together with the A1, A2, A3, A4, A5 and A6 outputs of the flip-flops 26G...B. The complementary outputs $\overline{A1}$, $\overline{A2}$, etc. of these flip-flops are, of course, logical "0". The outputs of inverting gate 24H and flip-flop 26H are logical "0" in response to the logical "1" output of the sign comparator 22H where the analog signal is connected to the inverting lead.

To summarize, when a −6.1 volt analog signal is being converted to digital form, the A1, A2, A3, A4, A5, A6 and $\overline{A7}$ outputs of the clock controlled flip-flops 26 are all logical "1" and the remainder of the outputs of these flip-flops (including 26H) are logical "0".

The output of NAND inverting gate 30A, which constitutes the $2^0$bit, is logical "0" since the four inputs to the gate are all logical "1" because the A2, A4, A6 and A7 inputs to the NAND inverting gates 28A...D are logical "0". Similarly, since both the A4 and A6 input to gate 28G are logical "1", the output of NAND inverting gate 28G is logical "0" and the output of NAND inverting gate 30B, which constitutes the $2^1$ bit, is logical "1". Likewise, because both the A2 and A4 drives of gate 28H are logical "1", the $2^2$ bit, i.e. the output of gate 30C, is logical "1".

It is by now apparent that there has been disclosed a very rapid analog-to-digital signal converter that requires only a single-pulse interval for operation. The limitation on the frequency of the clock 12 is, basically, the time required for the logic levels to set up in response to a signal, a time period that in modern components is of the order of 7 nanoseconds per gating level. It can therefore be appreciated that the frequency of clock 12, and the rapidity of signal conversion, can be quite high. Such rapid operation is advantageous in being inherently more accurate (more readouts per second) and less costly and complex since the conventional sample and hold circuitry is not usually required. It should also be mentioned that extremely high speeds of operation are attainable only by having all signals pass through the same number of logic levels, thereby preserving (without conventional synchronizing circuitry) the time correspondence of the various signals.

Obviously many modifications and variations of the present invention are possible in the light of the above teachings. It is therefore to be understood, that within the scope of the appended claims, the invention may be practiced otherwise than as specifically described.

What is claimed and desired to be secured by Letters Patent of the United States is:

1. A high-speed analog-to-digital signal converter comprising:

Clock means for producing a high-frequency control signal;

Multilevel detector means connected to receive said high-frequency clock control signal, a bipolar analog input signal and at least one source of reference voltage and functioning to produce, for each control signal received, a signal representative of the polarity of said analog input signal and $2^n-1$ complementary pairs of signals indicative of whether the absolute value of said analog input signal exceeds $2^n-1$ different and predetermined fractions of said reference voltage;

Coding means connected to receive said $2^n-1$complementary pairs of signals produced by said multilevel detector means and functioning to produce an $n$-bit signal which is representative of the absolute value of the analog signal, where $n$ is an integer greater than one, and Delay means connected to receive said polarity representative signal produced by said multilevel detector and functioning to delay said polarity representative signal for an interval of time substantially equal to the time required by said coding means to convert said $2^n-1$ complementary pairs of signals into said $n$-bit signal.

2. The high-speed analog-to-digital converter set forth in claim 1 wherein said multilevel detector means includes: $2(2^n-1)$ resistors connected in a series chain between a positive reference voltage source and a negative reference source;

$2(2^n-1)+1$ comparator circuits each connected to receive the analog input signal and individually connected to different points of said resistor chain;

$2^n$ NAND inverting gates connected to the output of said comparator circuits and $2^n$ flip-flop circuits each connected to receive the high-frequency control signal from said clock means and individually connected to one of said NAND inverting gates.

3. The high-speed analog-to-digital converter set forth in claim 2 wherein the $n$-bit signal produced by said coding means is representative in binary code of the absolute value of the analog input signal.

4. The high-speed analog-to-digital converter set forth in claim 1 wherein said coding means includes a plurality of logic levels, each level containing NAND inverting gates, the first of said plurality of logic levels being connected to receive the $2^n-1$ complementary pairs of signals produced by said multilevel detector means and the output of the last of said plurality of logic levels being said $n$-bit signal which is representative of the absolute value of said analog signal.

5. The high-speed analog-to-digital converter set forth in claim 4 wherein said delay means includes a plurality of series connected NAND inverting gates equal in number to said plurality of logic levels.

6. The high-speed analog-to-digital converter set forth in claim 5 wherein the *n*-bit signal produced by the last of said plurality of logic levels is representative in binary code of the absolute value of the analog input signal.

7. A high-speed analog-to-digital signal converter comprising:

Clock means for producing a high-frequency control signal;

A plurality of resistors connected in a series chain between a positive reference voltage source and a negative reference voltage source;

A plurality of comparator circuits each connected to receive the same bipolar analog input signal and individually connected to different points of said resistor chain;

A plurality of NAND inverting gates connected to the output of said comparator circuits and A plurality of flip-flop circuits each connected to receive the high-frequency control signal from said clock means and individually connected to one of said NAND inverting gates.

Whereby said pluralities of resistors, comparator circuits, NAND inverting gates and flip-flop circuits cooperatively produce for each clock means control signal and as the output of said plurality of flip-flop circuits a plurality of signals indicative of the polarity of said bipolar analog input signal and of whether the absolute value of said analog input signal exceeds different and predetermined fractions of said reference voltages and A plurality of connected logic levels, each level containing a plurality of NAND inverting gates, the first of said plurality of logic levels being connected to the said plurality of flip-flop circuits and the output of the last of said plurality of logic levels being signals indicative of the polarity of said bipolar analog input signal and of the magnitude of the absolute value of said bipolar analog input signal as expressed in binary code.